United States Patent
Buchin et al.

(10) Patent No.: US 6,638,787 B1
(45) Date of Patent: Oct. 28, 2003

(54) HIGH-FRAME-RATE CCD IMAGING DEVICES MADE IN LOW-PRODUCTION RUNS FROM OTHERWISE ORDINARY AND INEXPENSIVE CCD DEVICES

(75) Inventors: Michael Paul Buchin, Palo Alto, CA (US); Toshikazu Hori, Milpitas, CA (US)

(73) Assignees: Pulnix America, Inc., Sunnyvale, CA (US); Stanford Photonics, Inc., Palo Alto, CA (US)

( * ) Notice: Subject to any disclaimer, the term of this patent is extended or adjusted under 35 U.S.C. 154(b) by 0 days.

(21) Appl. No.: 10/010,637

(22) Filed: Dec. 4, 2001

(51) Int. Cl.[7] .............................................. H01L 21/00
(52) U.S. Cl. .......................................... 438/75; 257/215
(58) Field of Search ........................... 315/366, 367; 438/75, 60; 257/215

(56) References Cited

U.S. PATENT DOCUMENTS 6,255,134 B1    7/2001   Hori

Primary Examiner—David Vu
(74) Attorney, Agent, or Firm—Thomas E. Schatzel; Law Offices of Thomas E. Schatzel

(57) ABSTRACT

A fast frame-rate imaging device is produced by a attaching a fiberoptic block to an otherwise ordinary and inexpensive CCD. A part of the fiberoptic block is occluded so as to darken a majority of the active imaging photocells. The CCD imaging device is operated at near its maximum horizontal and vertical clock rates, but multiple image frames are defined within the one previous active photocell array field. The added dark areas in the optical field protect the recent frames still in transit within the active array area from being double exposed and thus corrupted. The serial output of the thus-modified CCD imaging device is reinterpreted to include more frames than originally at a multiple equal to the original array dimension divided by the new array dimension ($m \cdot n/m' \cdot n'$). Such a modified CCD array uses only one-fourth of the original active area, and is operable at a multiple of the original frame rate.

8 Claims, 3 Drawing Sheets

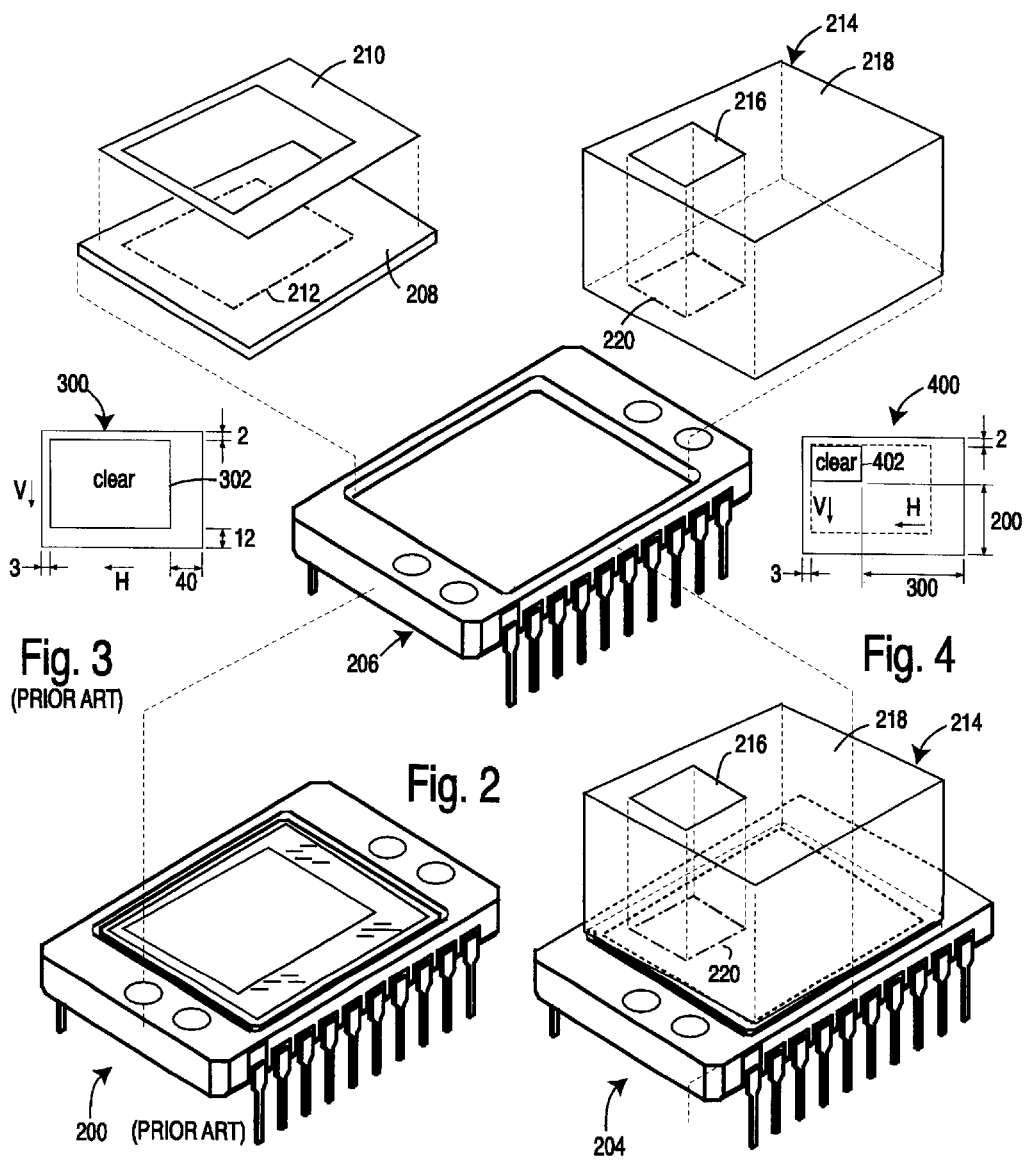

HIGH-FRAME-RATE CCD IMAGING DEVICES MADE IN LOW-PRODUCTION RUNS FROM OTHERWISE ORDINARY AND INEXPENSIVE CCD DEVICES

FIELD OF THE INVENTION

The present invention relates to electronic imaging devices, and more particularly to semiconductor processing methods for producing varieties of otherwise ordinary and inexpensive CCD array devices that can operate faster than one hundred frames-per-second.

DESCRIPTION OF THE PRIOR ART

U.S. Pat. No. 6,255,134 B1, issued Jul. 3, 2001, to one of the present inventors, Toshikazu Hori, describes a modification to an otherwise standard CCD imaging device that can improve its performance. Such comprises modifying the optical mask of an otherwise ordinary and inexpensive CCD integrated circuit to darken a majority of the active imaging photocells. The CCD integrated circuit is operated at near its maximum horizontal and vertical clock rates, but multiple image frames are defined within the one previous active photocell array field. The added dark areas in the optical mask protect the recent frames still in transit within the active array area from being double exposed and thus corrupted. The serial output of the thus-modified CCD device is reinterpreted to include more frames than originally at a multiple equal to the original array dimension divided by the new array dimension (m·n/m'·n'). So a modified CCD array that used only one-fourth of the original active area could be operated at four times the original frame rate. Such Patent is incorporated herein by reference.

A certain minimum production quantity is necessary to justify changing or adding a new mask to a commodity CCD device. When the needed volumes of pieces are too low to interest a semiconductor producer, something else is needed to accomplish the same ends as described in the above Patent.

SUMMARY OF THE INVENTION

It is therefore an object of the present invention to provide a CCD imaging device that can operate at frame rates over one hundred frames-per-second.

It is another object of the present invention to provide a CCD imaging device that is inexpensive to manufacture.

It is a further object of the present invention to provide a method for modifying an inexpensive CCD imaging device that can be done economically in low production volumes.

Briefly, a CCD imaging device embodiment of the present invention comprises attaching a fiberoptic block to an otherwise ordinary and inexpensive CCD integrated circuit. A part of the fiberoptic block is occluded so as to darken a majority of the active imaging photocells. The CCD integrated circuit is operated at near its maximum horizontal and vertical clock rates, but multiple image frames are defined within the one previous active photocell array field. The added dark areas in the optical field protect the recent frames still in transit within the active array area from being double exposed and thus corrupted. The serial output of the thus-modified CCD device is reinterpreted to include more frames than originally at a multiple equal to the original array dimension divided by the new array dimension (m·n/m'·n'). Such a modified CCD array uses only one-fourth of the original active area, and is operable at a multiple of the original frame rate.

An advantage of the present invention is that a CCD imaging device is provided that can operate at frame rates over one hundred frames-per-second and is inexpensive to manufacture.

Another advantage of the present invention is that a CCD imaging device with a very fast frame rate is obtainable by attaching a fiberoptic block aperature to an otherwise ordinary and commodity type CCD imaging device.

These and other objects and advantages of the present invention will no doubt become obvious to those of ordinary skill in the art after having read the following detailed description of the preferred embodiments which are illustrated in the drawing figure.

IN THE DRAWINGS

FIG. 2 is an exploded assembly diagram that shows on the left the prior art device that uses most of the active photocells, on the right is shown a modified assembly and product of the present invention where a fiberoptic block with occluded portion is used that darkens most of the otherwise available active photocells;

FIG. 3 is a diagram that represents the prior art fiberoptic block with occluded portion normally included in conventional devices like the Kodak KAI1001, and shows that the top two rows and the bottom twelve rows of active photocells are blocked, as are the first three columns and the last forty columns;

Figure 5:
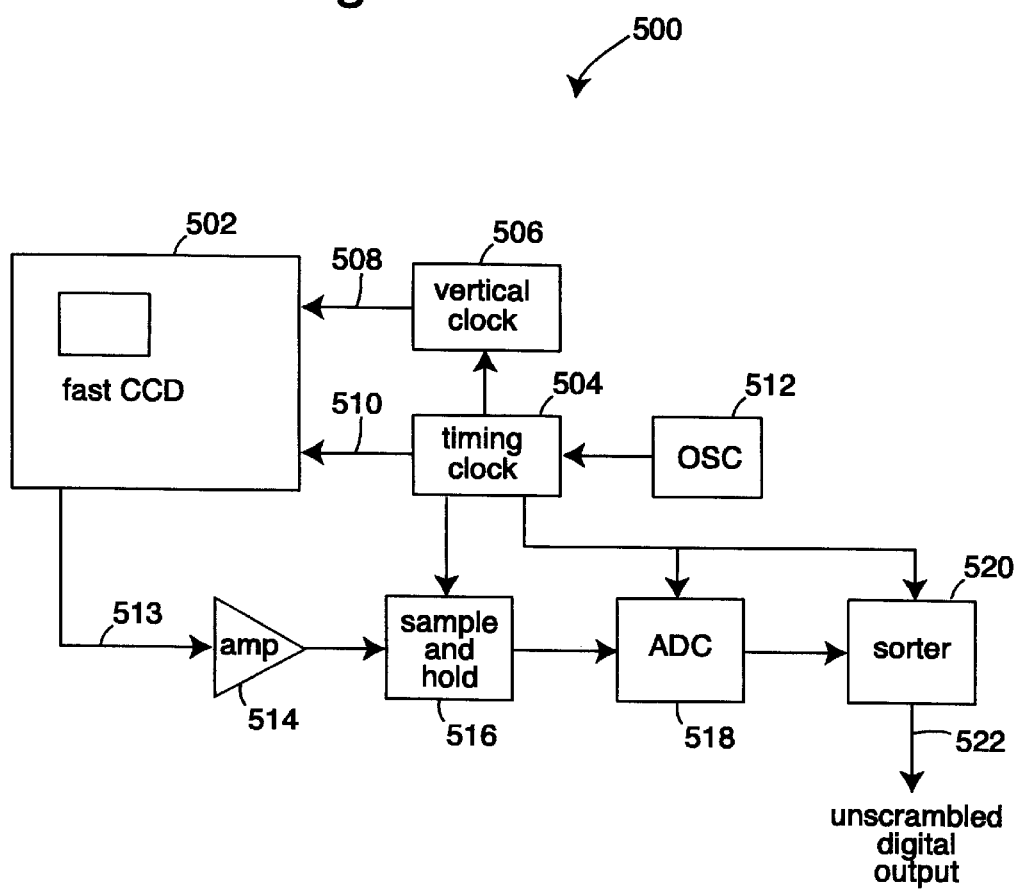

FIG. 4 is a diagram that represents a fiberoptic block with occluded portion of the present invention that would replace the one of FIGS. 2 and 3 in devices like the Kodak KAI1001, and shows that the top two rows and the bottom two hundred rows of active photocells are blocked, as are the first three columns and the last three hundred columns; and FIG. 5 is a functional block diagram that represents an application of a fast frame-rate CCD imaging device system embodiment of the present invention.

DETAILED DESCRIPTION OF THE PREFERRED EMBODIMENT

Figure 1:
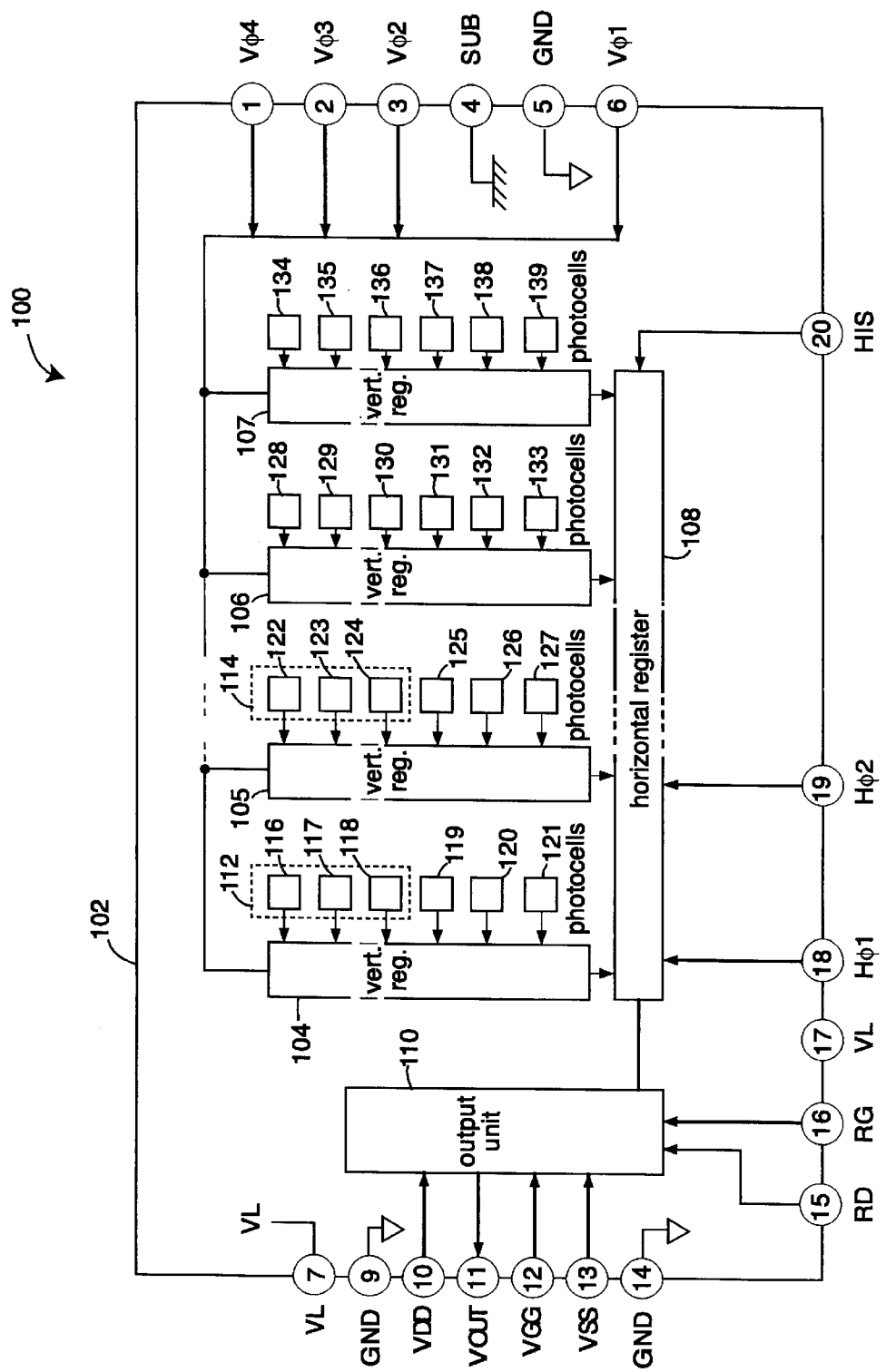
FIG. 1 is a functional block diagram of a fast frame-rate CCD imaging device embodiment of the present invention that has been implemented by modifying a Kodak KAI1001.

A fast frame-rate CCD imaging device embodiment of the present invention is illustrated in FIG. 1 and is referred to herein by the general reference numeral 100. The system 100 includes an integrated circuit (IC) 102 on which is fabricated a plurality of vertical shift registers 104–107 connected to feed a horizontal shift register 108. In a typical CCD device like the Kodak KAI0372, there will be 811 vertical shift registers that are 508 pixels tall that build an array that is about 410K pixels. The effective pixel array of a Kodak KAI0372 is 768(H) by 494(V) for an array of about 380K pixels. An output unit 110 amplifies the serial output of the horizontal shift register 108 to produce a video output (Vout) on a package pin "11".

A pair of fiberoptic apertures 112 and 114 are limited to an exposure of less than half of these 768(H) by 494(V) pixels in a Kodak KAI0372. Such has been modified in this example according to the present invention by attaching a fiberoptic block with an occluded portion.

As a consequence, a group of active photo-sensitive photocells 116–121 have been dived by fiberoptic aperture 112 into still-exposed photocells 116–118 and newly occluded photocells 119–121. Similarly, a group of active photo-sensitive photocells 122–127 have been divided by fiberoptic aperture 114 into still-exposed photocells 122–124 and newly occluded photocells 125–127. A group of remaining photocells 128–139 are all permanently darkened by the occlusions in the attached fiberoptic block.

FIG. 1 is simplified to show only an array four wide (4H) by six high (6V) for a total active matrix area of twenty-four pixels. Actual device embodiments of the present invention will have arrays much larger than the simple one represented in FIG. 1. Fiberoptic apertures 112 and 114 only allow two columns of pixels, three pixels high, to receive an image. So a new frame is defined herein to have a matrix area of six pixels, or one fourth the size of an array that would be possible if all photocells 116–139 are exposed.

The advantage is, this six pixel array can be exposed at four times the rate the larger twenty-four pixel can, given the same vertical and horizontal transfer clocking rates.

In operation, photocells 119–121 act as temporary storage for photocells 116–118. Similarly, photocells 125–127 act as temporary storage for photocells 122–124. Photocells 128–139 provide zero values that are clocked into horizontal register 108. Such zero values are overwritten by values provided by photocells 116–118 and 122–124 in subsequent frames.

In the following tables, the two vertical shift registers 104 and 105 that are connected in FIG. 1 to the unblocked photocells 116–118 and 122–124 are each represented as two columns six pixels high. The bottom row of twenty-four pixels represents the horizontal shift register 108. Each time the device 100 is clocked, the vertical shift registers move their photocell-captured information down one stage and the horizontal shift register moves such left one stage. The photocell-captured information that drops out the bottom of each vertical shift register is deposited into the cell immediately below in the horizontal shift register. The output of device 100 is taken from the left-most cell of the bottom row of twenty-four pixels.

Table I shows the starting condition where frame-1, consisting of a 2×3 array, is captured.

TABLE I

Frame-1 is captured

|  |  |  |  |  |  |  |  |  | 1 |  |  |  |  |  |  |  |  |  | 1 |  |  |  |
|---|---|---|---|---|---|---|---|---|---|---|---|---|---|---|---|---|---|---|---|---|---|---|
|  |  |  |  |  |  |  |  |  | 1 |  |  |  |  |  |  |  |  |  | 1 |  |  |  |
|  |  |  |  |  |  |  |  |  | 1 |  |  |  |  |  |  |  |  |  | 1 |  |  |  |
|  |  |  |  |  |  |  |  |  | x |  |  |  |  |  |  |  |  |  | x |  |  |  |
|  |  |  |  |  |  |  |  |  | x |  |  |  |  |  |  |  |  |  | x |  |  |  |
|  |  |  |  |  |  |  |  |  | x |  |  |  |  |  |  |  |  |  | x |  |  |  |
|  |  |  |  |  |  |  |  |  |  |  |  |  |  |  |  |  |  |  |  |  |  |  |

Table II shows the situation three clocks later where the frame-1 2×3 image has been shifted down into the cells darkened by the modified fiberoptic block with occluded portion of the present invention. This permits an electronic shutter to capture frame-2 in the 2×3 array represented by photocells 116–118 and 122–124.

TABLE II

Frame 1 is Shifted, Frame-2 is Captured

|  |  |  |  |  |  |  |  |  | 2 |  |  |  |  |  |  |  |  |  | 2 |  |  |  |
|---|---|---|---|---|---|---|---|---|---|---|---|---|---|---|---|---|---|---|---|---|---|---|
|  |  |  |  |  |  |  |  |  | 2 |  |  |  |  |  |  |  |  |  | 2 |  |  |  |
|  |  |  |  |  |  |  |  |  | 2 |  |  |  |  |  |  |  |  |  | 2 |  |  |  |
|  |  |  |  |  |  |  |  |  | 1 |  |  |  |  |  |  |  |  |  | 1 |  |  |  |
|  |  |  |  |  |  |  |  |  | 1 |  |  |  |  |  |  |  |  |  | 1 |  |  |  |
|  |  |  |  |  |  |  |  |  | 1 |  |  |  |  |  |  |  |  |  | 1 |  |  |  |
|  |  |  |  |  |  |  |  |  |  |  |  |  |  |  |  |  |  |  |  |  |  |  |

Table III shows the situation another three clocks later where the frame-1 2×3 image has been shifted down into the horizontal shift register and shifted left. The frame-2 2×3 image now resides in the cells darkened by the modified fiberoptic block with occluded portion of the present invention. The electronic shutter can then capture frame-3 in the 2×3 array represented by photocells 116–118 and 122–124.

TABLE III

Frames-1, 2 are Shifted, Frame-3 is Captured

|  |  |  |  |  |  |  |  |  | 3 |  |  |  |  |  |  |  |  |  | 3 |  |  |  |
|---|---|---|---|---|---|---|---|---|---|---|---|---|---|---|---|---|---|---|---|---|---|---|
|  |  |  |  |  |  |  |  |  | 3 |  |  |  |  |  |  |  |  |  | 3 |  |  |  |
|  |  |  |  |  |  |  |  |  | 3 |  |  |  |  |  |  |  |  |  | 3 |  |  |  |
|  |  |  |  |  |  |  |  |  | 2 |  |  |  |  |  |  |  |  |  | 2 |  |  |  |
|  |  |  |  |  |  |  |  |  | 2 |  |  |  |  |  |  |  |  |  | 2 |  |  |  |
|  |  |  |  |  |  |  |  |  | 2 |  |  |  |  |  |  |  |  |  | 2 |  |  |  |
|  |  |  |  |  |  |  |  | 1 | 1 | 1 |  |  |  |  |  |  |  |  | 1 | 1 | 1 |  |

Table IV shows the situation another three clocks later where the frame-1 2×3 image has been shifted left another three cells and frame-2 has been shifted down from the vertical shift registers and then left in the horizontal shift register. The frame-3 2×3 image now resides in the cells darkened by the modified fiberoptic block with occluded portion of the present invention. The electronic shutter can then capture frame-4 in the 2×3 array represented by photocells 116–118 and 122–124.

TABLE IV

Frames 1–3 are Shifted, Frame-4 is Captured

|  |  |  |  |  |  |  |  |  | 4 |  |  |  |  |  |  |  |  |  | 4 |  |  |  |
|---|---|---|---|---|---|---|---|---|---|---|---|---|---|---|---|---|---|---|---|---|---|---|
|  |  |  |  |  |  |  |  |  | 4 |  |  |  |  |  |  |  |  |  | 4 |  |  |  |
|  |  |  |  |  |  |  |  |  | 4 |  |  |  |  |  |  |  |  |  | 4 |  |  |  |
|  |  |  |  |  |  |  |  |  | 3 |  |  |  |  |  |  |  |  |  | 3 |  |  |  |
|  |  |  |  |  |  |  |  |  | 3 |  |  |  |  |  |  |  |  |  | 3 |  |  |  |
|  |  |  |  |  |  |  |  |  | 3 |  |  |  |  |  |  |  |  |  | 3 |  |  |  |
|  |  |  |  |  | 1 | 1 | 1 | 2 | 2 | 2 |  |  |  |  |  | 1 | 1 | 1 | 2 | 2 | 2 |  |

Table V shows the situation three more clocks later where the frame 1 and 2 images have been shifted left another three cells and frame-3 has been shifted down from the vertical shift registers and then left in the horizontal shift register. The frame-4 2×3 image now resides in the cells darkened by the modified fiberoptic block with occluded portion of the present invention. The electronic shutter can then capture frame-5 in the 2×3 array represented by photocells 116–118 and 122–124.

TABLE V

Frames 1–4 are Shifted, Frame-5 is Captured

|   |   |   |   |   |   |   |   |   | 5 |   |   |   |   |   |   |   |   |   |   | 5 |
|---|---|---|---|---|---|---|---|---|---|---|---|---|---|---|---|---|---|---|---|---|
|   |   |   |   |   |   |   |   |   | 5 |   |   |   |   |   |   |   |   |   |   | 5 |
|   |   |   |   |   |   |   |   |   | 5 |   |   |   |   |   |   |   |   |   |   | 5 |
|   |   |   |   |   |   |   |   |   | 4 |   |   |   |   |   |   |   |   |   |   | 4 |
|   |   |   |   |   |   |   |   |   | 4 |   |   |   |   |   |   |   |   |   |   | 4 |
|   |   |   |   |   |   |   |   |   | 4 |   |   |   |   |   |   |   |   |   |   | 4 |
|   |   | 1 | 1 | 1 | 2 | 2 | 2 | 3 | 3 | 3 |   |   | 1 | 1 | 1 | 2 | 2 | 2 | 3 | 3 | 3 |

Table VI shows the situation three more clocks later where the frame 1–3 images have been shifted left another three cells and frame-4 has been shifted down from the vertical shift registers and then left in the horizontal shift register. The frame-5 2×3 image now resides in the cells darkened by the modified fiberoptic block with occluded portion of the present invention. The electronic shutter can then capture frame-6 in the 2×3 array represented by photocells 116–118 and 122–124. The very first output from the device will occur on the next clock cycle from the left-most cell of the horizontal shift register. It should be clear from the contents of the horizontal shift register represented in Table VI that some sorting will be required to undo the mixture of frames 1–4 that has occurred. In an unmodified CCD device, the horizontal shift register at this point would contain only one frame of information, not four frames. So this is how the embodiments of the present invention are able to multiply the frame rate of an otherwise ordinary CCD device, albeit at reduced resolution.

TABLE VI

Frames 1–5 are Shifted, Frame-6 is Captured

|   |   |   |   |   |   |   |   |   |   |   |   | 6 |   |   |   |   |   |   |   |   |   |   |   | 6 |
|---|---|---|---|---|---|---|---|---|---|---|---|---|---|---|---|---|---|---|---|---|---|---|---|---|
|   |   |   |   |   |   |   |   |   |   |   |   | 6 |   |   |   |   |   |   |   |   |   |   |   | 6 |
|   |   |   |   |   |   |   |   |   |   |   |   | 6 |   |   |   |   |   |   |   |   |   |   |   | 6 |
|   |   |   |   |   |   |   |   |   |   |   |   | 5 |   |   |   |   |   |   |   |   |   |   |   | 5 |
|   |   |   |   |   |   |   |   |   |   |   |   | 5 |   |   |   |   |   |   |   |   |   |   |   | 5 |
|   |   |   |   |   |   |   |   |   |   |   |   | 5 |   |   |   |   |   |   |   |   |   |   |   | 5 |
| 1 | 1 | 1 | 2 | 2 | 2 | 3 | 3 | 3 | 4 | 4 | 4 |   | 1 | 1 | 1 | 2 | 2 | 2 | 3 | 3 | 3 | 4 | 4 | 4 |

FIG. 2 illustrates a prior art commodity CCD imaging device 200 that is converted by a method embodiment of the present invention into a modified CCD imaging device 204 having improved speed. Both, for example, use a dual inline pin (DIP) ceramic package 206. In the prior art device 200, a semiconductor chip 208 ordinarily includes an optical mask 210 with a large aperture that creates an active imaging area 212.

As part of the modification embraced by the present invention, a fiberoptic block 214 is bonded directly to the semiconductor chip 208 and optical mask 210. An optical epoxy is preferably used for such attachment. A clear area coherent-light conduit 216 is surrounded by an occluded space 218. The occluded space 218 typically provides five decades of light attenuation and may be constructed of black glass.

Such clear area conduit 216 typically comprises many parallel fiberoptic light pipes with a pitch finer than the pixel spacing pitch of the imaging photocells in the active imaging area 220 of semiconductor chip 208. For example, a pitch of four microns is a practical size that would be used in many applications.

Material mechanical matching and differences in the thermal coefficients of expansion should be considered. The occluded space 218 may comprise darkened glass, or a sawed off and re-attached fiberoptic block with its parallel fiberoptic light pipes turned orthogonal to the clear area conduit 216 direction of light travel. The advantage of that would be a perfect mechanical match between the transmissive and non-transmissive parts of the fiberoptic block 214.

The attachment of the fiberoptic block 214 to the semiconductor chip 208 and optical mask 210 is such that minimal light leakage occurs between pixels at an interface at an active imaging area 220. The fiberoptic block 214 may also be stepped around its perimeter shoulders to allow secondary attachment to the device package 206. The occluded space 218 creates an imaging area 220 that uses a minority of the CCD photocells arrayed within the chip 208. A frame-rate multiplication during use is made possible by clocking the photocell image information from the unblocked CCD imaging photocells in area 220 into the permanently darkened CCD imaging photocells when a next image frame exposure occurs.

FIG. 3 represents an optical mask 300 that is normally included in conventional devices like the Kodak KAI0372. A large aperture 302 allows all but the top two rows, the bottom twelve rows, the first three columns, and the last forty columns of active photocells to receive light.

FIG. 4 is a diagram that represents a fiberoptic block with occluded portion of the present invention that would attach to a CCD device like the Kodak KAI0372. An aperture 402 allows all but the top two rows, the bottom two hundred rows, the first three columns, and the last three hundred columns of active photocells to receive optical images.

FIG. 5 represents an application of a fast frame-rate CCD imaging device system embodiment of the present invention, and is referred to herein by the general reference numeral 500. A fast frame-rate CCD imaging device 502 is connected to a horizontal rate timing clock 504 and a vertical rate timing clock 506. A vertical sync signal 508 and a horizontal sync signal 510 are both derived from a system oscillator 512. An output signal 513 contains a serially scrambled mixture of more than one image frame. A buffer 514 amplifies the signal for a sample and hold unit 516. An analog-to-digital converter (ADC) 518 produces a binary digital word equivalent of the analog image signals captured by the CCD 502. A sorter 520 writes a digital memory array with the digitized image signals as they are received. It then sorts them into corresponding frames for an organized frame-by-frame output signal 522. Sorter 520 is described here as a digital device, but an analog sorter based on CCD memory technology could alternatively be substituted in front of the ADC 518.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. In a commercially finished fast frame-rate charge-coupled device (CCD) imaging device having a semiconductor chip with a single active photocell array field comprising an m-by-n array of CCD imaging photocells and an optical mask with a large aperture defining said single active photocell array, the improvement comprising:

a fiberoptic block bonded directly to the semiconductor chip and optical mask, and over the m-by-n array of CCD imaging photocells;

a plurality of parallel fiberoptic light pipes disposed in the fiberoptic block normal to said single active photocell array field, and with a pitch finer than the pixel spacing pitch of the imaging photocells in the active imaging area of said semiconductor chip;

an optical epoxy disposed between the fiberoptic block and the semiconductor chip and optical mask, and providing for a permanent attachment, and such that any light leakage that occurs between pixels at an interface at an active imaging area is minimal;

an occlusion disposed in the fiberoptic block such that a majority of such CCD imaging photocells are permanently darkened, and multiple whole image frames are provided for within the one previous active photocell array field; and a serial output of the thus-modified CCD device for providing a reinterpretation of more whole image frames than existed originally in said commercially finished CCD, at a multiple equal to the original array dimension divided by the new array dimension;

wherein, a frame-rate multiplication during use is made possible by a clocking of photocell image information from a first plurality of unblocked CCD imaging photocells when a next image frame exposure occurs, and that can thereby operate faster than one hundred frames-per-second.

2. The device of claim 1, further comprising:

a sorter connected to receive and unscramble a mixture of image frame information that is output from said horizontal shift register.

3. The device of claim 1, wherein:

the occlusion comprises black glass.

4. The device of claim 1, wherein:

the horizontal shift register outputs a serially scrambled mixture of more than one image frame.

5. A method for converting a first CCD imaging device with a first maximum frame-rate capability to a second CCD imaging device with a second, much higher maximum frame-rate capability, the method comprising the steps of:

obtaining a CCD imaging device with an m-by-n array of photocells;

attaching a fiberoptic block to said first CCD imaging device to control which fraction of said m-by-n array of photocells will receive input light; and occluding a portion of said fiberoptic block such that a majority of such CCD imaging photocells are permanently darkened;

wherein, a frame-rate multiplication during use is made possible by a clocking of photocell image information from a first plurality of unblocked CCD imaging photocells into a second plurality of permanently darkened CCD imaging photocells when a next image frame exposure occurs.

6. The method of claim 5, wherein:

the step of occluding the fiberoptic block is completed before the step of attaching.

7. The method of claim 5, wherein:

the step of occluding the fiberoptic block comprises redirecting a group of fiberoptic light pipes orthogonal to input light to said CCD imaging device, wherein such act as an area of occlusion.

8. The method of claim 5, wherein:

the step of occluding the fiberoptic block comprises replacing a group of fiberoptic light pipes with darkened glass.

* * * * *